United States Patent
Bai

(10) Patent No.: US 8,368,466 B2
(45) Date of Patent: Feb. 5, 2013

(54) ORTHOGONAL BASIS FUNCTION SET FOR DIGITAL PREDISTORTER

(75) Inventor: Chunlong Bai, Kanata (CA)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 42 days.

(21) Appl. No.: 13/119,157

(22) PCT Filed: Nov. 16, 2010

(86) PCT No.: PCT/IB2010/055195
§ 371 (c)(1),
(2), (4) Date: Mar. 15, 2011

(87) PCT Pub. No.: WO2012/066383
PCT Pub. Date: May 24, 2012

(65) Prior Publication Data
US 2012/0119831 A1    May 17, 2012

(51) Int. Cl.
    H03F 1/26          (2006.01)
(52) U.S. Cl. ....................................... 330/149
(58) Field of Classification Search .................. 330/149; 375/297; 455/114.3
    See application file for complete search history.

(56) References Cited

U.S. PATENT DOCUMENTS

| | | | |
|---|---|---|---|
| 6,236,837 B1 | 5/2001 | Midya | |
| 6,240,278 B1 | 5/2001 | Midya et al. | |
| 6,798,843 B1 | 9/2004 | Wright et al. | |
| 7,149,257 B2 | 12/2006 | Braithwaite | |
| 7,295,815 B1 | 11/2007 | Wright et al. | |
| 7,577,211 B2 * | 8/2009 | Braithwaite | 375/296 |
| 2005/0163250 A1 | 7/2005 | McCallister | |
| 2005/0163268 A1 | 7/2005 | McCallister et al. | |
| 2008/0008263 A1 | 1/2008 | Keerthi et al. | |
| 2008/0144709 A1 | 6/2008 | McCallister et al. | |
| 2009/0124218 A1 | 5/2009 | McCallister et al. | |
| 2009/0302940 A1 | 12/2009 | Fuller et al. | |

OTHER PUBLICATIONS

Oh, D. G. et al. "Adaptive Nonlinear Equalizer with Reduced Computational Complexity." Signal Processing Elsevier Science Publishers B.V., Amsterdam, NL, vol. 47, No. 3, Dec. 1, 1995.

Raich, R. et la. "Orthogonal Polynomials for Power Amplifier Modeling and Predistorter Design." IEEE Transactions on Vehicular Technology, vol. 53, No. 5, Sep. 2004.

Badoin, G. et al. "Adaptive Polynomial Pre-Distortion for Linearization of Power Amplifiers in Wireless Communications and WLAN." International Conference on Trends in Communications, Bratislava, Slovakia, 2001.

Li, H. et al. "Nonlinear Least Squares Lattice Algorithm for Identifying the Power Amplifier with Memory Effects." Proceedings of the 2006 Vehicular Technology Conference, May 10, 2006.

Raich, R. et al. "Orthogonal Polynomials for Power Amplifier Modeling and Predistorter Design." IEEE Transactions on Vehicular Technology, vol. 53, No. 5, Sep. 2004.

Ren, K. et al. "Identification of Memory Polynomial Nonlinear Models for RF Power Amplifiers with a Systolic Array Based QRD-RLS Algorithm." 2008 Asia-Pacific Microwave Conference, Dec. 16, 2008.

* cited by examiner

Primary Examiner — Steven J Mottola
(74) Attorney, Agent, or Firm — Coats & Bennett, P.L.L.C.

(57) ABSTRACT

A predistorter applies a distortion function to an input signal to predistort the input signal. The output of the distortion function is modeled as the sum of the output signals from the orthogonal basis functions weighted by corresponding weighting coefficients. Techniques are described for orthogonalizing the basis function output signals depending on the distribution of the input signal.

14 Claims, 9 Drawing Sheets

ORTHOGONAL BASIS FUNCTION SET FOR DIGITAL PREDISTORTER

BACKGROUND

The present invention relates generally to techniques for constructing physical models of non-linear electronic devices and, more particularly, to methods and apparatus for compensating an input signal for distortion introduced to the input signal by an electronic device.

The design of radio-frequency power amplifiers for communications applications often involves a trade-off between linearity and efficiency. Power amplifiers are typically most efficient when operated at or near the saturation point. However, the response of the amplifier at or near the point of saturation is non-linear. Generally speaking, when operating in the high-efficiency range, a power amplifier's response exhibits non-linearities and memory effects.

One way to improve a power amplifier's efficiency and its overall linearity is to digitally predistort the input to the power amplifier to compensate for the distortion introduced by the power amplifier. In effect, the input signal is adjusted in anticipation of the distortion to be introduced by the power amplifier, so that the output signal is largely free of distortion products. Generally, the predistortion is applied to the signal digitally, at baseband frequencies, i.e., before the signal is upconverted to radio frequencies.

These techniques can be quite beneficial in improving the overall performance of a transmitter system, in terms of both linearity and efficiency. Furthermore, these techniques can be relatively inexpensive, due to the digital implementation of the predistorter. In fact, with the availability of these techniques, power amplifiers may be designed in view of more relaxed linearity requirements than would otherwise be permissible, thus potentially reducing the costs of the overall system.

SUMMARY

The present invention provides a model of an orthogonal basis function set for use in a predistortion system. A predistorter applies a distortion function to an input signal to predistort the input signal. The distortion function is modeled by a set of orthogonal basis functions. More particularly, the output of the predistorter is modeled as the sum of the output signals from the orthogonal basis functions weighted by corresponding weighting coefficients. Techniques are described for orthogonalizing the basis function output signals depending on the distribution of the input signal.

In some exemplary embodiments, a method is provided for compensating for distortion of an input signal by an electronic device that operates on the input signal to produce an output signal. In one exemplary method a set of model coefficients for a two-dimensional lattice prediction model of a basis function set are computed from a set of input signal samples over a predetermined sampling interval. The lattice prediction model represents basis functions in a predistorter basis function set as different combinations of power basis functions. A corresponding set of predistorter connection coefficients for combining power basis function output signals to generate basis function output signals is determined from the model coefficients. A set of power basis function output signals is computed from an input signal and the set of power basis functions. The set of predistorter connection coefficients is applied to the power basis function output signals to produce a set of basis function output signals, and the basis function output signals are combined to produce a predistorted input signal from the input signal.

In other embodiments of the invention, a predistorter circuit is provided to compensate for distortion of an input signal by an electronic device that operates on the input signal to produce an output signal. One exemplary predistorter circuit comprises a basis function modeling circuit and a predistorter. The basis function modeling circuit computes a set of model coefficients for a two-dimensional lattice prediction model of a basis function set from a set of input signal samples over a predetermined sampling interval. The lattice prediction model represents basis functions in a predistorter basis function set as different combinations of power basis functions in a set of power basis functions. The basis function modeling circuit then determines, from the set of model coefficients, a corresponding set of predistorter connection coefficients for combining power basis function output signals from the power basis functions to generate orthogonalized basis function output signals. The model coefficients computed by the basis function modeling circuit are used to configure the predistorter. The predistorter computes a set of power basis function output signals from an input signal and the set of power basis functions. The predistorter then applies the set of predistorter connection coefficients to the power basis function output signals to produce a set of basis function output signals, and combines the basis function output signals to produce a predistorted input signal from the input signal.

In embodiments of the present invention, an orthogonal basis function set is determined based on the actual input signal. Therefore, the orthogonal basis function set derived is customized to the distribution of the input signal. With the proposed orthogonal basis function set, data signals derived from the orthogonal basis function set can be used to construct a well-conditioned matrix, which is beneficial for evaluation of the predistorter weighting coefficients.

DETAILED DESCRIPTION

Figure 1:
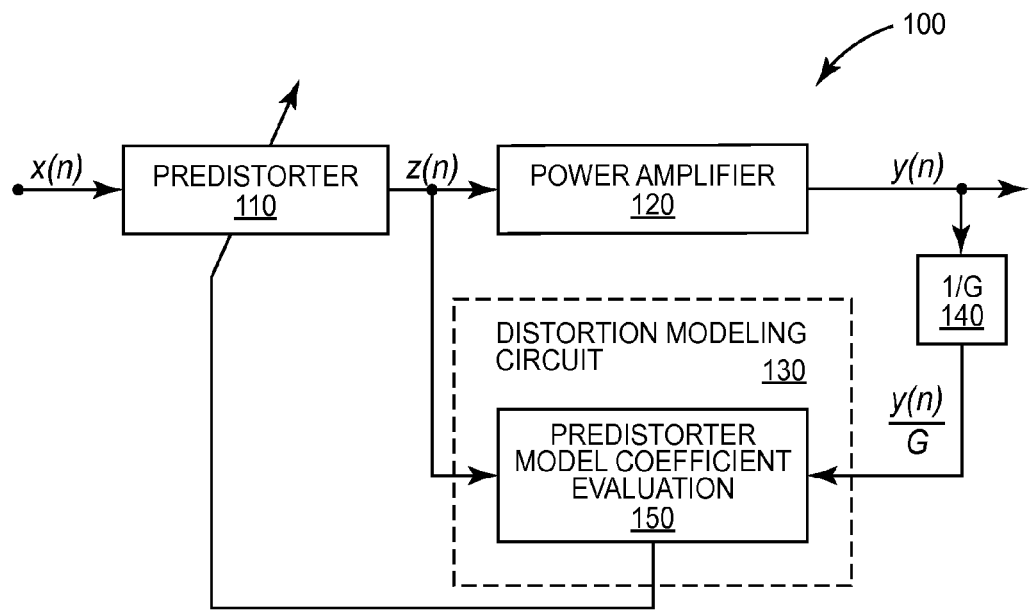
FIG. 1 illustrates an indirect model for a predistortion circuit.

Referring now to the drawings, FIG. 1 illustrates a digital predistortion system 100 configured to compensate for the distortion introduced to a communication signal by a power amplifier 120. A power amplifier 120 is typically most efficient when it is operating in a non-linear range. However, the non-linear response of a power amplifier 120 causes out-of-band emissions and reduces the spectral efficiency in a communication system. A predistorter 110 may be used to improve power amplifier efficiency and linearity by distorting the input signal to the power amplifier 120 to compensate for the non-linear distortion introduced by the power amplifier 120. The cascading of a predistorter 110 and power amplifier 120 improves the linearity of the output signal and thus allows a power amplifier 120 to operate more efficiently. Although predistortion is used in the circuits and systems described herein to linearize the output of a power amplifier 120, those skilled in the art will appreciate that the techniques described are more generally applicable to linearize the output of any type of non-linear electronic device.

As seen in FIG. 1, an input signal x(n) is input to the predistorter 110. The predistorter 110 predistorts the input signal x(n) to compensate for the distortion introduced by the power amplifier 120 when the power amplifier 120 is operated in a non-linear range. The predistorted input signal z(n) produced by the predistorter 110 is then applied to the input of the power amplifier 120. The power amplifier 120 amplifies the predistorted input signal z(n) to produce an output signal y(n). If predistorter 110 is properly designed and configured, then the output signal y(n) contains fewer distortion products and out-of-band emissions than if power amplifier 120 were used alone.

To compensate for the distortion introduced by power amplifier 120, predistorter 110 must have a non-linear transfer function that effectively reverses the non-linear effects of the power amplifier 120. To properly configure the predistorter 110, an appropriate model for this non-linear transfer function is needed. Two different approaches to deriving this non-linear transfer function are possible. The first approach utilizes an indirect-learning architecture, as pictured in FIG. 1, and the second approach uses the direct-learning architecture of FIG. 2. In both cases, the signal z(n) input to power amplifier 120 and a scaled version of the amplifier output signal y(n) are applied to a distortion modeling circuit 130. The scaling, illustrated as attenuator 140 in FIGS. 1 and 2, reflects the net linear gain G that is desired from the combination of predistorter 110 and power amplifier 120. Scaling the output signal y(n) by the inverse of G permits the non-linearities introduced by power amplifier 120 to be analyzed independently from its gain.

In the indirect-learning architecture of FIG. 1, a general structure for a model of predistorter 110 is taken as a given, and its coefficients (parameters) are estimated directly from the input and outputs of power amplifier 120. The distortion modeling circuit 130 includes a coefficient evaluation circuit 160 to evaluate the amplifier input signal z (n) and the amplifier output signal y(n)/G according to a predetermined non-linear model for the predistorter to determine a set of weighting coefficients to be applied by the predistorter 110. This process is described in further detail below. With this indirect approach, a model for the power amplifier 120 is not derived. Rather, the non-linear characteristics of power amplifier 120 are learned indirectly, through the modeling of the predistortion necessary to counteract the distortion introduced by power amplifier 120.

Figure 2:
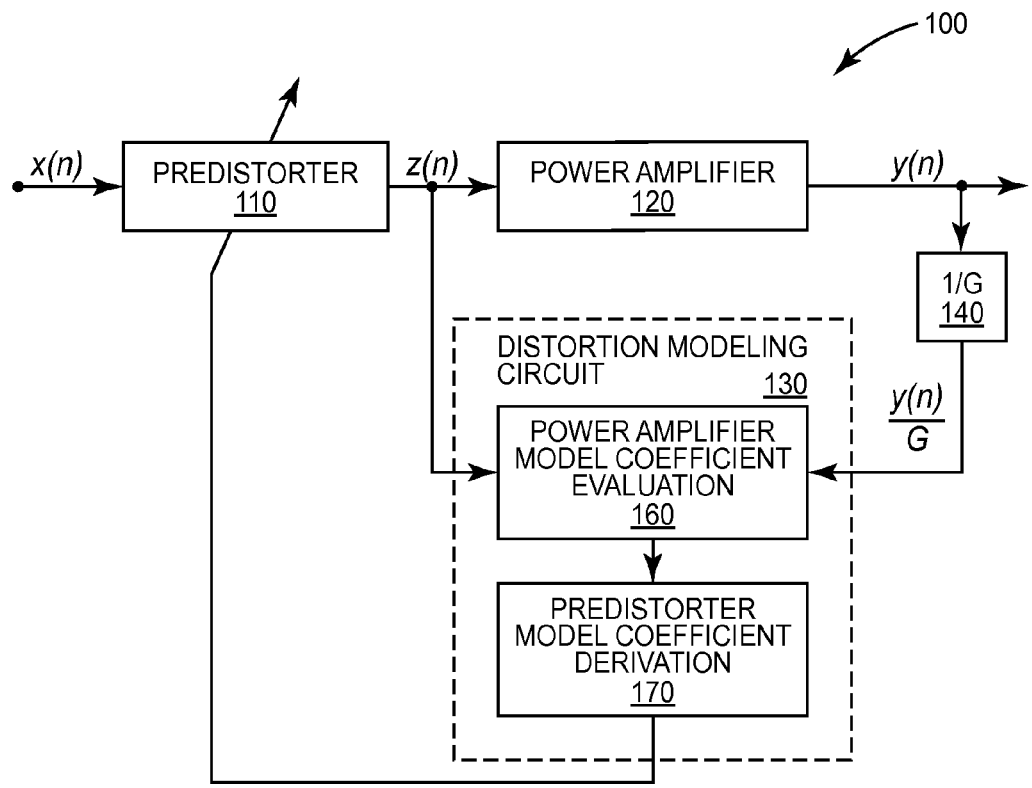
FIG. 2 illustrates a indirect model for a predistortion circuit.

In contrast, the direct-learning architecture of FIG. 2 directly characterizes the non-linear performance of power amplifier 120. The power amplifier includes a coefficient evaluation circuit 160 to evaluate the amplifier input signal z(n) and the amplifier output signal y(n)/G according to a predetermined non-linear model for the power amplifier 120. The weighting coefficients that best fit the power amplifier's non-linear characteristics to the power amplifier model in block 120 are then used by a coefficient derivation circuit 170 to generate weights for configuring the predistorter 110.

The distortion introduced by the predistorter 110 or power amplifier 120 can be represented by a complicated non-linear function, which will be referred to herein as the distortion function. One approach to modeling a distortion function, referred to herein as the decomposition approach, is to decompose the distortion function into a set of less complicated basis functions and compute the output of the distortion function as the weighted sum of the basis function outputs. The set of basis function used to model the distortion function is referred to herein as the basis function set.

Figure 3:
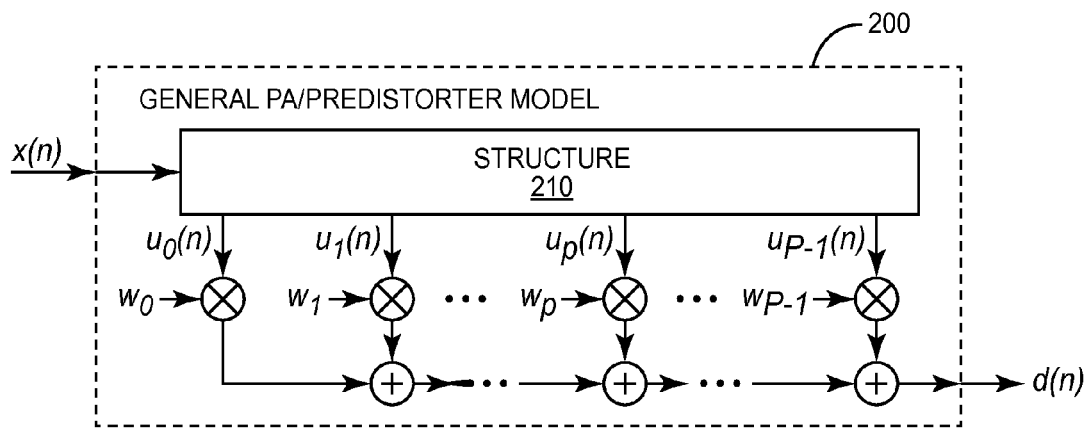
FIG. 3 illustrates a generic distortion model for modeling distortion introduced by a predistorter or power amplifier.

FIG. 3 illustrates a generalized distortion model 200, which may represent the distortion introduced by the power amplifier 120 (e.g., as modeled by model coefficient evaluation unit 160 in the direct learning architecture of FIG. 2) or the predistortion transfer function of predistorter (e.g., as modeled by the predistorter model coefficient evaluation unit 160 of FIG. 1). In either case, the distortion model 200 comprises a structure 210 corresponding to a desired basis function set. The model structure 210 includes P taps, where each tap corresponds to a basis function. It should be noted that, in some embodiments, multiple taps may correspond to the same basis function. The model structure 210 operates on the input signal x(n) to produce data signals $\{u_0(n), (n), u_1(n), \ldots u_{p-1}(n)\}$ at the respective taps. The distortion model 200 then computes a weighted sum of the data signals $\{u_0(n), (n), u_1(n), \ldots u_{p-1}(n)\}$ to obtain a distorted input signal d(n). More specifically, the data signals $\{u_0(n), (n), u_1(n), \ldots u_{p-1}(n)\}$ are multiplied by corresponding weighting coefficients $\{w_0(n), (n), w_1(n), \ldots w_{p-1}(n)\}$, and the resulting products are added together to obtain d(n).

The distortion model shown in FIG. 3 can be represented by:

$$d(n) = \sum_{p=0}^{P-1} w_p u_p(n) \qquad \text{Eq. 1}$$

Equation 1 can be written as a linear equation according to:

$$d(n) = u^T(n)w \qquad \text{Eq. 2}$$

where u is a P×1 vector of data signals output by the model structure at time n and w is a P×1 vector of the weighting coefficients applied to respective data signals.

For a given vector u, d(n) is the desired output of the distortion model 200. In the direct learning architecture, d(n) is the actual output of power amplifier 120. In the indirect-learning architecture, d(n) is the desired output of predistorter 110. The weighting coefficients w that best fit the vector u to the desired output d(n) over a period of time can be learned by fitting multiple observations of u to the corresponding desired outputs d(n). For a set of observations over N sampling instances, the corresponding linear equations given in Equation 2 can be expressed as:

$$U \cdot w = d \qquad \text{Eq. 3}$$

where U is a N×P matrix of data signals and d is an N×1 vector corresponding to the desired output signal of the distortion model for each of the N sampling instances. The columns of the matrix U correspond to the data signals output by respective taps and the rows correspond to different sampling instances. Equation 3 can be evaluated according to well known techniques (e.g., to minimize a criterion such as a least-square-error criterion) to find the weights w that best model the distortion of the amplifier 120 or the predistorter 110.

Figure 4:
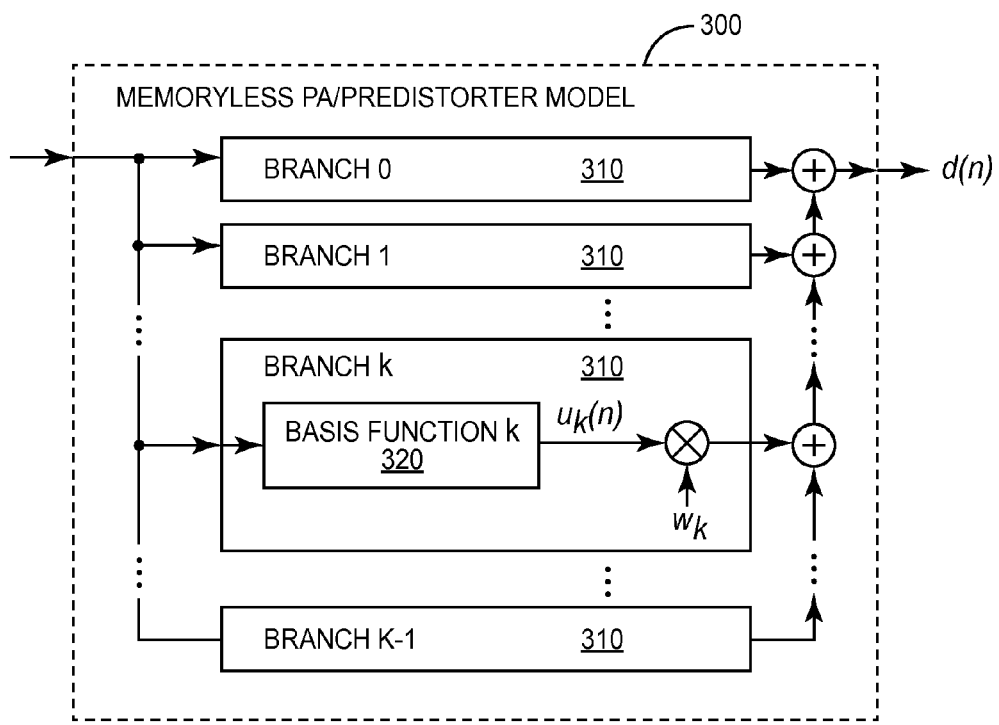
FIG. 4 illustrates a distortion model without memory for modeling distortion introduced by a predistorter or power amplifier.

FIG. 4 illustrates an exemplary memoryless distortion model 300 for modeling a non-linear system, such as a power amplifier or predistorter. The distortion model 300 comprises K branches 310, each corresponding to one of K basis functions 320 in a basis functions set. For convenience, the k-th branch 310 corresponds to a basis function of the k-th order. An input signal sample x(n) passes through each branch 310 and is operated on by the basis function 320 to generate a data sample $u_k(n)$, which may also be referred to more specifically in this model as the basis function output signal. For each input signal sample x(n), the branches 310 generate a corresponding set of basis function output signals $u_k(n)$. The basis function output signal $u_k(n)$ for the k-th branch 310 can be expressed as:

$$u_k(n) = f_k(x(n)) \qquad \text{Eq. 4}$$

where $f_k(\cdot)$ denotes a basis function of the k-th order. It may be noted that the model is memoryless so the basis function output signal $u_k(n)$ depends only on the current input sample x(n). The basis functions output signals $\{u_0(n), (n), u_1(n), \ldots u_{K-1}(n)\}$ are multiplied by corresponding weighing coefficients $\{w_0(n), (n), w_1(n), \ldots w_{K-1}(n)\}$ and the resulting products are summed to obtain the distorted input signal d(n).

Comparing the memoryless distortion model 300 shown in FIG. 4 with the general distortion model 200 of FIG. 3, it may be noted that the number of branches K in the memoryless distortion model 300 equals the number of taps P in the general distortion model 200. It may also be noted that the basis function output signals $\{u_0(n), (n), u_1(n), \ldots u_{K-1}(n)\}$ output for a given sampling time instance n in the memoryless model 300 correspond to the data samples $\{u_0(n), (n), u_1(n), \ldots u_{p-1}(n)\}$ in the general distortion model 200. Thus, the model of FIG. 4 can be viewed as a special case of the distortion model 200 of FIG. 3 where K=P.

A distortion modeling circuit 130 using the distortion model shown in FIG. 4 computes the weighting coefficients $w_k(n)$ for the basis function output signals $u_k(n)$ given x(n) and d(n). Accordingly, the weights w that best model the distortion of the amplifier 120 or the predistorter 110 can be found in a similar manner to that described above, e.g., by fitting a matrix of N observations of the outputs of basis function set to a desired output signal vector d(n). Because distortion model 300 does not account for memory effects, the accuracy of this model relative to the actual distortion function of a given power amplifier 120 may be limited.

Figure 5:
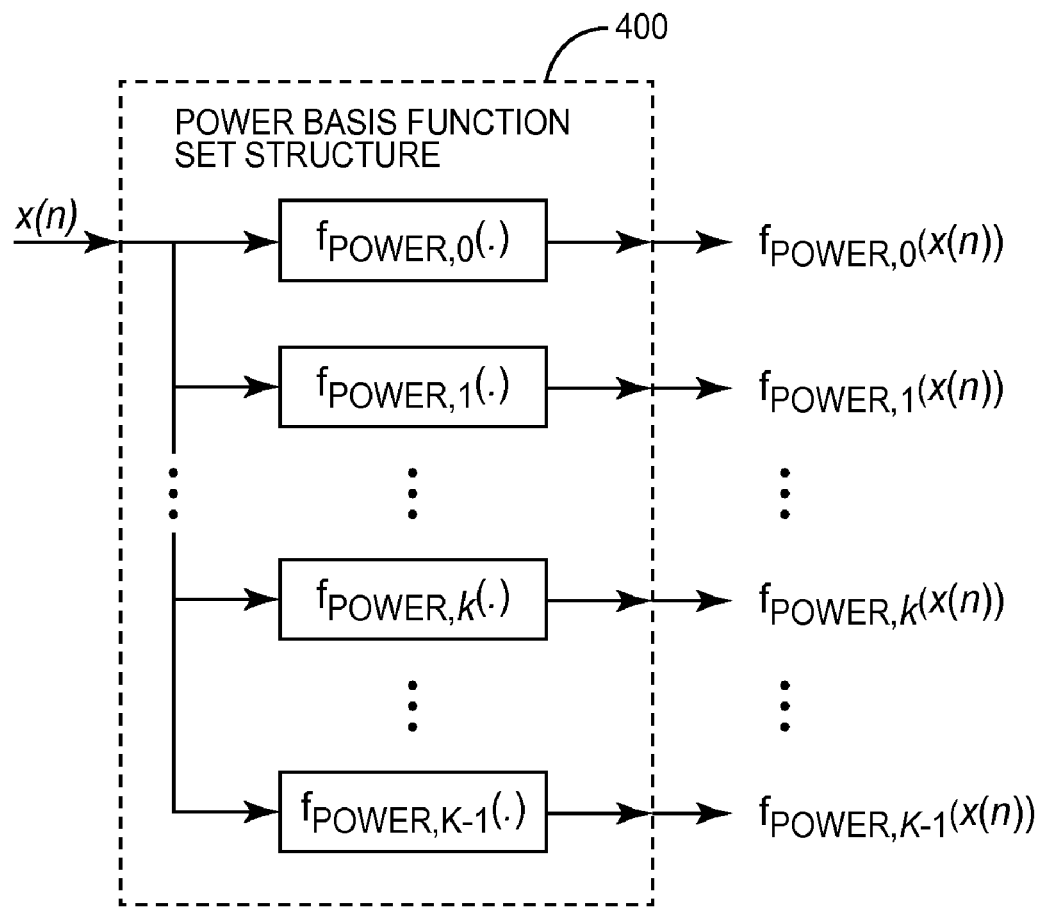
FIG. 5 illustrates an exemplary power basis function set for a distortion model.

The basis function set used to model the distortion function may comprise a set of power functions used in polynomial models. FIG. 5 illustrates a structure 400, which may be used to implement a set of power basis functions. The structure 400 may be implemented by hardware or by a processing circuit. The basis function structure 400 is constructed from K power basis functions, denoted $f_{POWER,k}(\cdot)$, where the subscript k indicates a power basis function of the k-th order and corresponds to one of the K branches in the distortion model 400. The input signal sample x(n) passes through each of the power basis functions $f_{POWER,k}(\cdot)$. For each input signal sample, the power basis functions generate a corresponding set of power basis function output signals $f_{POWER,k}(x(n))$. When the power basis functions are used, the data sample $u_k(n)$ can be expressed as:

$$u_k(n) = f_{POWER,k}(x(n)) = x(n)|x(n)|^k \qquad \text{Eq. 5}$$

The power basis function output signals are then weighted and summed as previously described to generate the output signal d(n) of the distortion model.

The basis function set may be designed based on the Voltaire series, which is widely used to model non-linear systems. In practical applications, a somewhat simplified model that contains fewer terms than the complete Voltaire series can be used to reduce the computational complexity without significantly impacting performance. For example, a polynomial model may be obtained by omitting all but the power terms and may be implemented as a multi-branch model where the power functions are used as a basis function and assigned to respective branches 410 of the basis function structure 400.

In some embodiments, an orthogonal basis function set may be derived as the sum of power basis function output signals weighted by corresponding scaling coefficients. In this case, the data samples output by the basis function set can be expressed by:

$$u_k(n) = f_{ORTHO,k}(x(n)) = \sum_{h=0}^{k} c_{k,h} f_{POWER,h}(x(n)) \qquad \text{Eq. 6}$$

where $f_{ORTHO,k}(x(n))$ denotes an orthogonal basis function of the k-th order, the term $c_{k,h}$ is the weighting factor applied to the h-th order power basis function to generate the k-th order orthogonal basis function $f_{ORTHO,k}(n)$. An orthogonal basis function set can be advantageous in many applications, as it can provide better numerical stability during the matrix mathematics used to evaluate weighting coefficients for the distortion models. An orthogonal basis function set can be constructed as a weighted summation of the power basis functions. An orthogonal basis function set can be advantageous in many applications, as it can provide better numerical stability during the matrix mathematics used to evaluate weighting coefficients for the distortion models.

Figure 6:
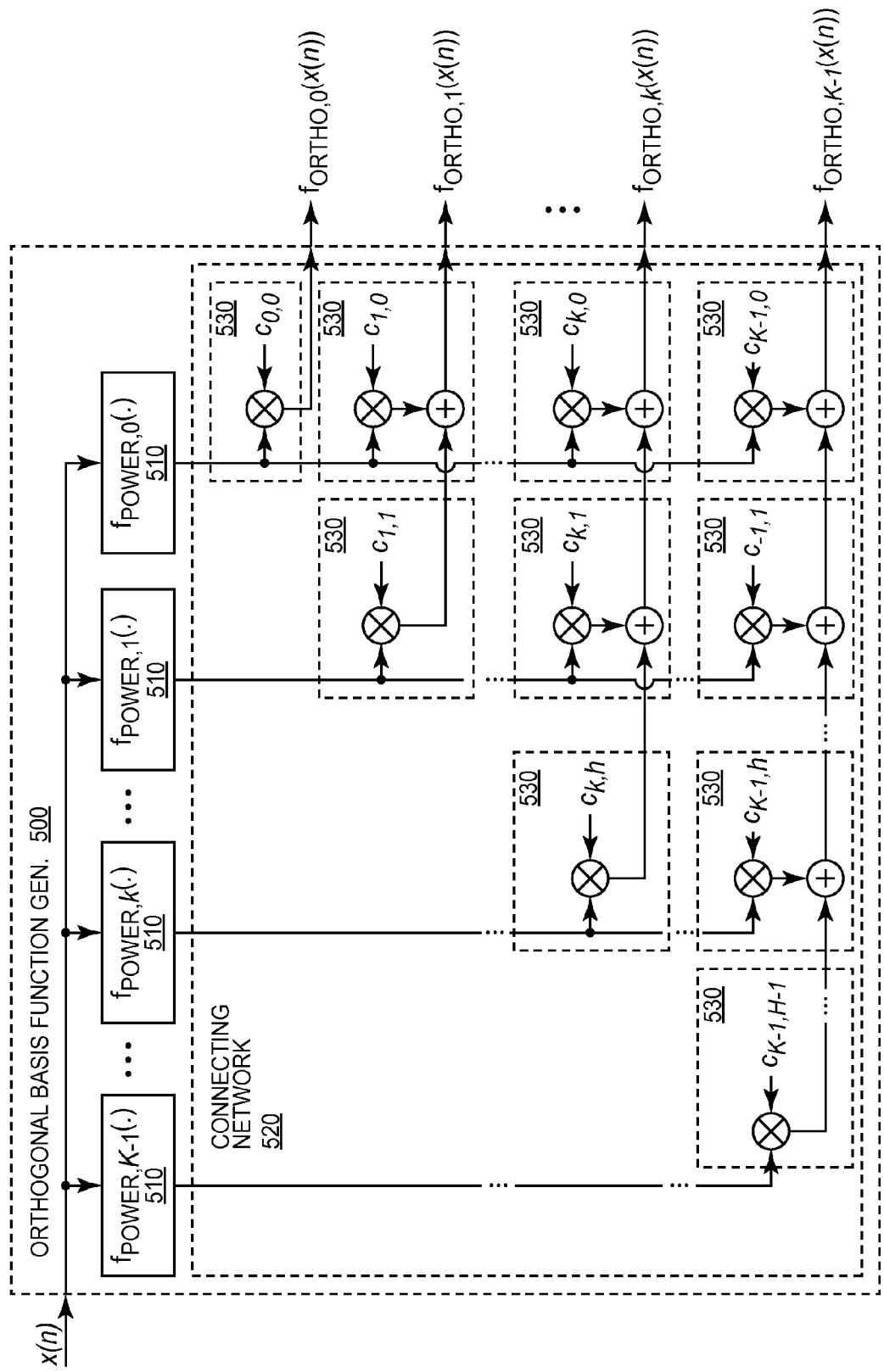
FIG. 6 illustrates an exemplary power basis function set for a distortion model.

FIG. 6 illustrates an exemplary basis function generator 500 to implement an orthogonal basis function set. The basis function generator 500 may be implemented by hardware or by a processing circuit. The basis function generator 500 comprises a series of root nodes 510 and a connecting network 520 comprising a plurality of connecting nodes 530. Each root node 510 implements a respective power basis function. There is a one-to-one correspondence between root nodes 510 and power basis functions. The input signal x(n) passes through each root node 510 and the power basis function for each root node 510 generates a corresponding power basis function output signal $f_{POWER,h}(x(n))$. The power basis function output signals form the input signals to the connecting network 520.

The connecting nodes 530 of the connecting network 520 receive one input and generate one output. For convenience, the connecting nodes 530 of the basis function generator 500 are denoted individually by $\text{Node}_{k,h}$, where the index h indicates a corresponding power basis functions and the index k indicates a corresponding orthogonal basis function. The input to $\text{Node}_{k,h}$ is the output of the power basis function for the h-th root node 510. Each connecting node 530 multiplies the input by a corresponding weighting factor $c_{k,h}$, referred to herein as the connection coefficient. In the case of connecting nodes 530 where k is greater than h, the connecting nodes 530 sum the weighted power basis function output signals. Each row of the connecting network 520 corresponds to one orthogonal basis function. The output of the last (rightmost)

connecting node 530 in each row comprises the output signal $f_{ORTHO,k}(x(n))$ from one of the orthogonal power basis functions.

An orthogonal basis function set can be designed based on various criteria. One design that works well for several common input signal distributions is derived in Raviv Raich, Hua Qian, and G. Tong Zhou, "Orthogonal polynomials for power amplifier modeling and predistorter design," IEEE Transactions on Vehicular Technology, vol. 53, no. 5, pp. 1468-1479, September 2004.

Figure 7:
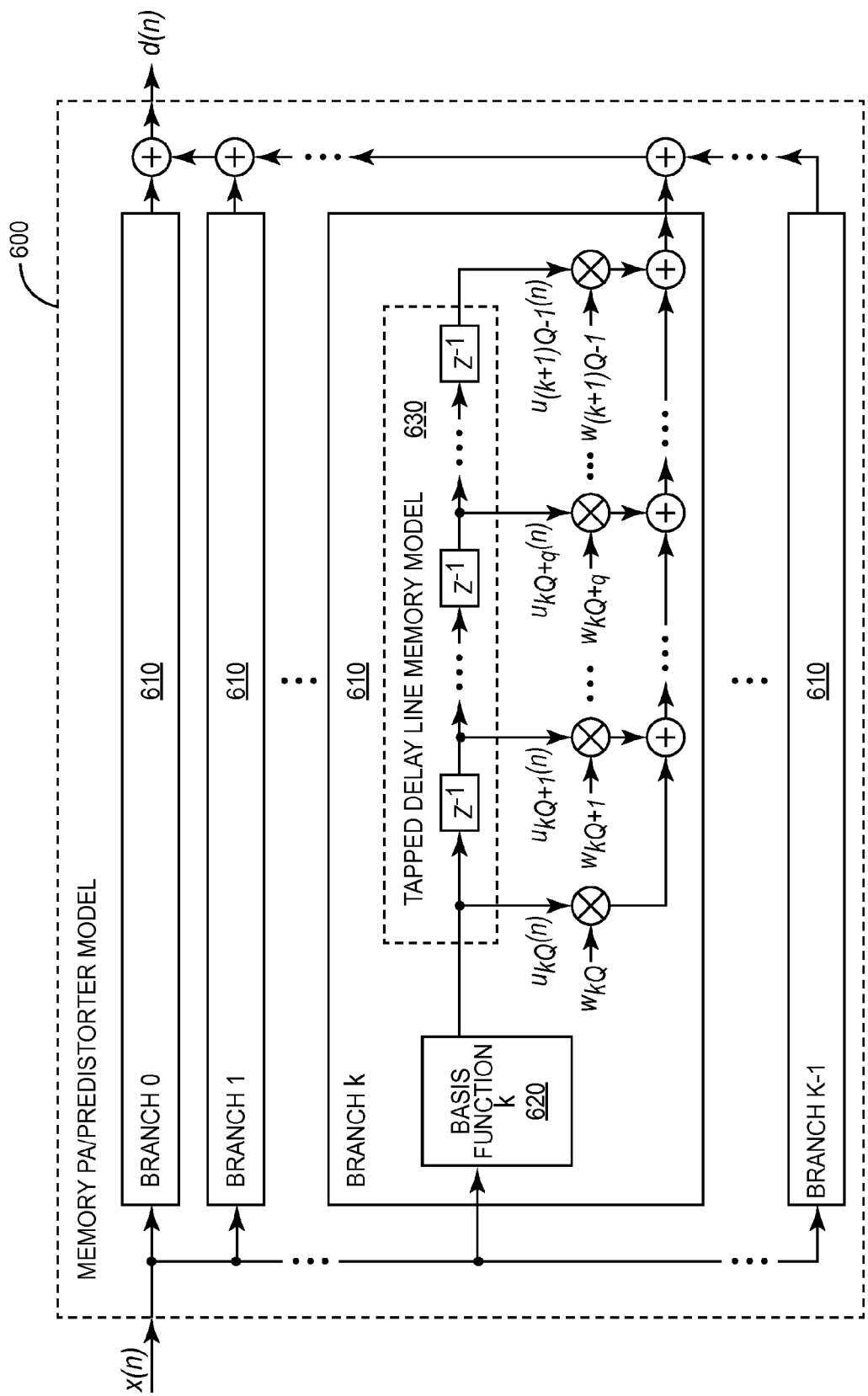
FIG. 7 illustrates a distortion model with memory for modeling distortion introduced by a predistorter or power amplifier.

Memory effects, i.e., the dependence of an output signal on prior states of the input signal as well as on the present state, can also be incorporated into a distortion function. FIG. 7 illustrates a non-linear distortion model 600 with memory. The distortion model 600 comprises K branches 610. Each branch 610 includes a basis function 620 followed by a corresponding memory model 630. The basis function 620, as previously noted, may be one of the power basis functions or orthogonal basis functions. In this model 600, the memory effects corresponding to each basis function are modeled as a tapped delay line with Q taps, where Q is the memory length of the memory model 630. Those skilled in the art will appreciate that other memory models, such as a lattice predictor memory model, could also be used. The output signal of each branch 610 is a weighted sum of basis function output signals produced by a corresponding basis function over Q sampling time instances, including the current sampling time instance and Q−1 previous sampling time instances. For example, if the basis function for branch k is $f_k(\cdot)$ and the input signal is $x(n)$, then the output of branch k is a weighted sum of $f_k(x(n))$, $f_k(x(n-1))$, $f_k(x(n-2))$, etc. The data signals $\{u_{kQ}(n), u_{kQ+1}(n), \ldots u_{kQ+q}(n), \ldots u_{(k+1)Q-1}(n)\}$ output from the memory model taps at the time n are multiplied by corresponding weighting coefficients $\{w_{kQ}(n), w_{kQ+1}(n), \ldots w_{kQ+q}(n), \ldots, w_{(k+1)Q-1}(n)\}$ and the resulting products are summed to produce k branch output signals. The K outputs from the K branches 610 are then summed to form the desired distortion signal d(n).

Comparing the distortion model 600 in FIG. 7 with the general model 200 in FIG. 3, it should be noted that the each branch 610 has Q taps and that there are a total of KQ taps and KQ corresponding weights. The total number of taps, KQ, in this model equals the number of taps, P, in the general model 200. It should further be noted that the KQ data signals $\{u_{kQ}(n), u_{kQ+1}(n), \ldots u_{kQ+q}(n), \ldots u_{(k+1)Q-1}(n)\}$ correspond to the P data samples $\{u_0(n), u_1(n) \ldots u_{p-1}(n)\}$ output by the model structure 210 in the general model 200.

A distortion modeling circuit 130 using the distortion model 400 shown in FIG. 5 computes the weighting coefficients $\{w_{kQ}(n), w_{kQ+1}(n), \ldots w_{kQ+q}(n), \ldots, w_{(k+1)Q-1}(n)\}$ for the memory model taps given x(n) and d(n). Thus, once more, the weights w (in this case a 1×KQ vector) can be estimated by recording N observations of the outputs of the KQ samples, to form a matrix U, and fitting the matrix U to a desired output signal vector d according to Equation 3 and a particular optimization criterion. Given an appropriate basis function set and a memory model of adequate depth, the resulting distortion will generally provide better models of real-world device distortion than a memoryless model.

As suggested in the discussion above, each of the models in FIGS. 3-7 includes a set of data samples u, that can be expressed by:

$$\underset{1 \times P}{u^T(n)} \cdot \underset{P \times 1}{w} = d(n) \qquad \text{Eq. 7}$$

This is true whether or not the model includes memory. In a memoryless model, the elements of $u^T$ consist only of the basis function output signals, i.e., each element is strictly a function of x(n). In a model with memory, $u^T$ also includes elements corresponding to delayed versions of the basis function output signals. Thus, some elements of $u^T$ may correspond to a function of $x(n-1)$, $x(n-2)$, etc. Note that in Equation 7 and as generally used herein, $(\cdot)^T$ denotes a transpose, $(\cdot)^H$ denotes a conjugate transpose, P is the number of coefficients in the model, the P×1 vector u(n) denotes all of the data samples in the model at a given time index n, the P×1 vector w denotes all the coefficients in the distortion model, and d(n) is the desired output of the model for time instance n.

For any given time index n, both u(n) and d(n) are known, and Equation 7 is a linear equation of w. As noted earlier, for observations obtained on N time indices, the corresponding linear equations expressed in Equation 7 can be compactly expressed as:

$$\underset{N \times P}{U} \cdot \underset{P \times 1}{w} = \underset{N \times 1}{d} \qquad \text{Eq. 8}$$

In Equation 8, U is the input data matrix and d is the desired output vector.

In the indirect-learning architecture of FIG. 1, d(n) is the desired output of predistorter 110, which ideally has a distortion function that perfectly compensates for the distortion introduced by power amplifier 120. Thus, d(n) corresponds to z(n), the input to power amplifier 120, when the indirect-learning architecture is used. The input signal to the distortion model, denoted x(n) in FIGS. 3-7, corresponds to the scaled output of the power amplifier 120, y(n)/G. Thus, for any given model structure, samples of the output from power amplifier 120 are taken for each of N sampling instances and applied to a set of basis functions to produce a matrix U. This matrix U is fitted to the desired output vector d according to Equation 8, where d is a vector of samples of the input to power amplifier, taken at the same N sampling instances used to form the matrix U.

As discussed earlier, the distortion characteristics for the power amplifier 120 are modeled directly in the direct-learning architecture, pictured in FIG. 2. In this case, the "desired" distortion signal d(n) corresponds to the scaled output of power amplifier 120, y(n)/G. The input x(n) to the model corresponds to the input signal of the power amplifier. Thus, for any given model structure, samples of the input from power amplifier 120 are taken for each of N sampling instances and applied to a set of basis functions to produce a matrix U. This matrix U is fitted to the desired output vector d according to Equation 8, where d is a vector of samples of the scaled output from the power amplifier, taken at the same N sampling instances used to form the matrix U.

Regardless of the details of the model structure, and regardless of whether the indirect-learning architecture or the direct-learning architecture is used, at the center of the coefficient evaluation in digital predistorter 110 of FIGS. 1 and 2 is the problem of estimating the coefficient vector w based on Equation 8 satisfying a certain criterion. In order to solve this estimation problem, inversion of the data matrix U, or $U^H U$, in some form is required. A well known measure of sensitivity of a matrix to digital operations, such as matrix inversion, is the so-called condition number, which is defined as the ratio of the maximum Eigen value of a matrix to its minimum Eigen value. Matrices with condition numbers near 1 are said to be well-conditioned.

Because matrix computations can be quite complex, an important goal in the design of a distortion model for a power amplifier 120 or a predistorter 110 is to provide to the coefficient evaluation algorithm a data matrix $U^H U$ that has a relatively small number of columns (to reduce the computational complexity of the matrix operations), that has a condition number as close to 1 as possible (high numerical stability), and that at the same time also models the physical behavior of the power amplifier or predistorter as exactly as possible, given a particular optimization criteria. Differences between the distribution of input signals used to derive the basis function set for the distortion model and the distribution of actual data applied to the predistorter 110 may result in a data matrix $U^H U$ with a large condition number.

This added instability is reflected in a significant increase, sometimes as much as by a factor of $10^6$, of the condition number of the data matrix that has to be inverted in the coefficient evaluation process. This problem can be quite serious in an adaptive digital pre-distortion system with memory, as the parameters in such a system have to be adapted "on the fly" to track the distortion characteristics of the power amplifier over time. One factor contributing to these high condition numbers is a mismatch between the signal distribution of the real-world signals and the signal distributions of the signals used to derive the orthogonal basis function set. Therefore, an orthogonal basis function set developed in view of a particular expected input signal distribution is unable to provide orthogonalized basis function outputs from a direct application to real signals.

Figure 8:
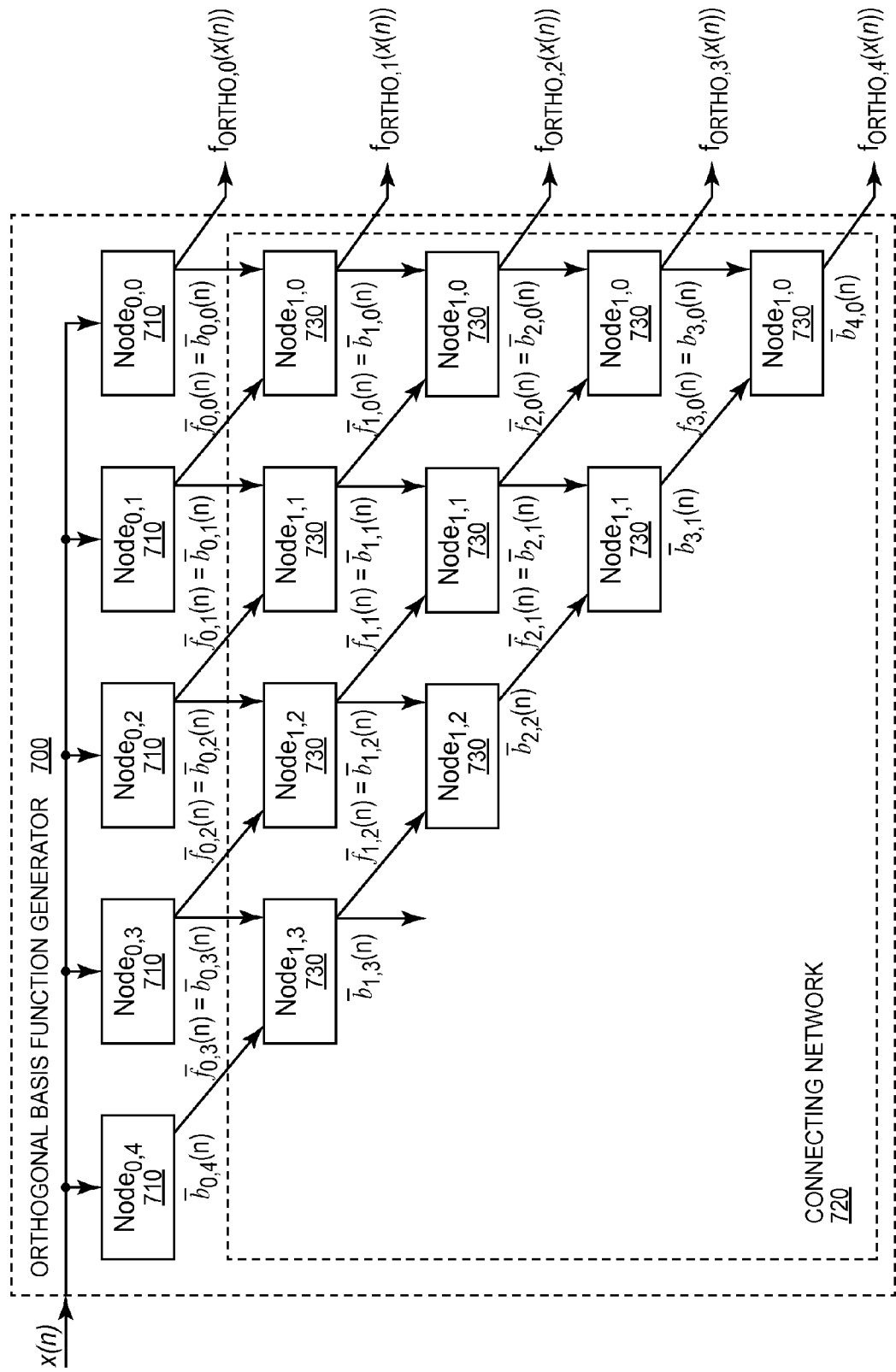
FIG. 8 illustrates an exemplary for an orthogonal basis function generator.

FIG. 8 illustrates an orthogonal basis function generator 700 for implementing an orthogonal basis function set. As described in more detail below, the orthogonal basis function generator 700 can be used to generate a set of orthogonalized basis function output signals based on the distribution of the input signals. Consequently, the matrix $U^H U$ formed from the basis function output signals will have a low condition number that makes the matrix $U^H U$ more suitable for coefficient evaluation.

The orthogonal basis function generator 700 comprises a plurality of root nodes 710 and a connecting network 720 comprising a plurality of connecting nodes 730. The nodes 710, 730 of the orthogonal basis function generator 700 are denoted by the notation $Node_{k,h}$, where the indices k and h denote rows and columns in FIG. 8. The input to the orthogonal basis function generator 700 is assumed to be a finite sequence of N input signal samples rather than a continuous stream. Because the input to the orthogonal basis function generator 700 is a finite sequence, a two-dimensional lattice structure is used to orthogonalize the basis function output signals as hereinafter described.

Each node 710, 730 in the orthogonal basis function generator 700 generates forward and backward prediction errors, denoted respectively by $f_{k,h}(n)$ and $b_{k,h}(n)$, for each sample time instance n. The forward and backward prediction errors $f_{k,h}(n)$ and $b_{k,h}(n)$ are then normalized to generate normalized forward and backward prediction errors, denoted respectively by $\tilde{f}_{k,h}(n)$ and $\tilde{b}_{k,h}(n)$. In the case of the root nodes 710, the normalized forward prediction error $\tilde{f}_{0,h}(n)$ equals the normalized backward prediction error $\tilde{b}_{0,h}(n)$. As will be described in greater detail below, the only input to the root nodes 710 during a sampling time instance is a single input signal sample x(n). The same input signal sample x(n) is applied to each root node 710. The connecting nodes 730 have two inputs each, which are the normalized forward prediction error $\tilde{f}_{k-1,h}(n)$ from $Node_{k-1,h}$ and the normalized backward prediction error $\tilde{b}_{k-1,h+1}(n)$ from $Node_{k-1,h+1}(n)$. The normalized backward prediction error $\tilde{b}_{k,0}(n)$ from $Node_{k,0}$, which denotes a node 710, 730 in the rightmost column of FIG. 8, is the output of the k-th order orthogonal basis function which may be expressed as:

$$f_{orth,k-1}(x(n)) = \tilde{b}_{k-1,0}(n) \qquad \text{Eq. 9}$$

It should be noted that the outputs of the orthogonal basis functions given by Eq. 9 are a function only of the current input sample x(n) and do not depend on previous or future input signal samples.

Figure 9:
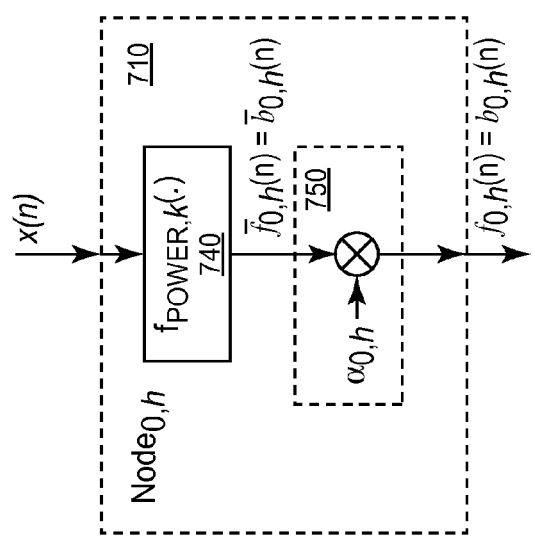
FIG. 9 illustrates the structure of a root node for an orthogonal basis function generator

FIG. 9 illustrates the structure of a root node 710. The root nodes 710 are denoted by the notation $Node_{0,h}$, i.e. nodes where k equals 0. The root nodes 710 each comprise a respective power basis function 740 and a normalization circuit 750. The power basis function 740 in each root node 710 operates on the input signal sample x(n) to generate the forward and backward prediction errors for the root node 710. That is, the forward and backward prediction errors $f_{k,h}(n)$ and $b_{k,h}(n)$ for the root nodes 710 equal the power basis function output signal $f_{power,h}(x(n))$. The normalization circuit 750 normalizes to a predetermined value the power basis function output signal $f_{power,h}(x(n))$ to generate normalized forward and backward prediction errors $\tilde{f}_{k,h}(n)$ and $\tilde{b}_{k,h}(n)$ for the root node 710. More particularly, the normalization circuit 750 multiplies the power basis function output signal $f_{power,h}(x(n))$ by a corresponding normalization factor $\alpha_{k,h}$ to generate normalized forward and backward prediction errors $\tilde{f}_{k,h}(n)$ and $\tilde{b}_{k,h}(n)$, which may be expressed as:

$$\tilde{b}_{0,h}(n) = \alpha_{0,h} b_{0,h}(n) = \alpha_{0,h} f_{power,h}(x(n)) \qquad \text{Eq. 10}$$

$$\tilde{f}_{0,h}(n) = \alpha_{0,h} f_{0,h}(n) = \alpha_{0,h} f_{power,h}(x(n)) \qquad \text{Eq. 11}$$

The normalization factor $\alpha_{0,h}$ applied by each root node 710 is a function of the variance of the input signal x(n) over a predetermined time period and the power basis function as will be describe below.

Figure 10:
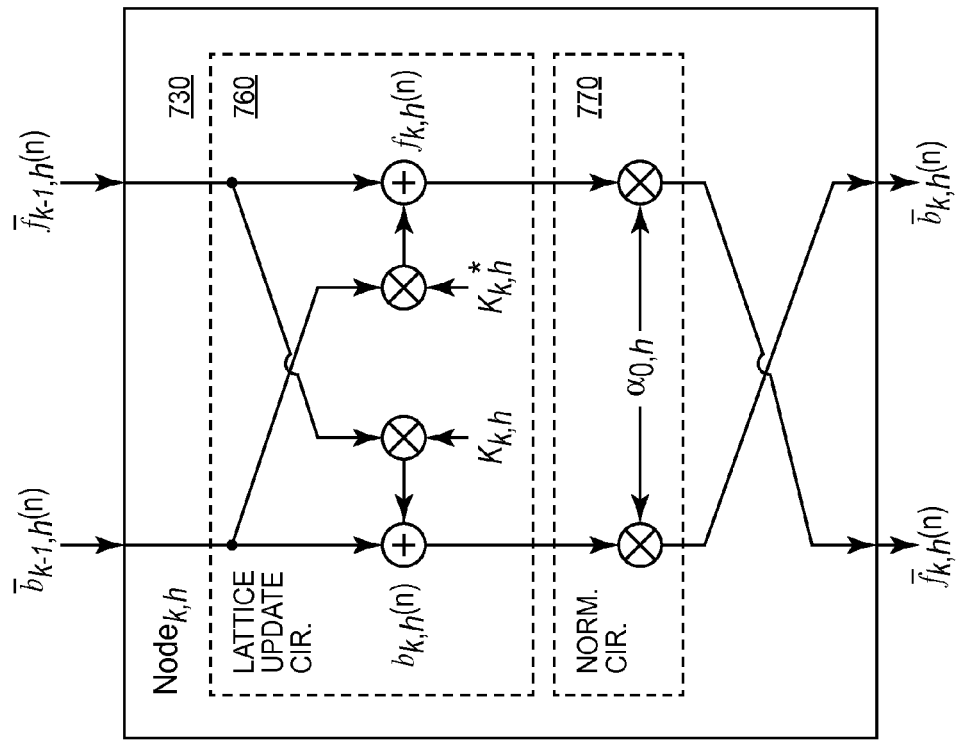
FIG. 10 illustrates a connecting node for an orthogonal basis function generator.

FIG. 10 illustrates the structure of a connecting node 730 of the connecting network 720. Each connecting node 730 in the connecting network 720 comprises a lattice update circuit 760 and a normalization circuit 770. As previously noted, the inputs to a given connecting node 730 comprise the normalized forward prediction error $\tilde{f}_{k-1,h}(n)$ from $Node_{k-1,h}$ and the normalized backward prediction error $\tilde{b}_{k-1,h+1}(n)$ from $Node_{k-1,h+1}$. The outputs of the connecting nodes 730 are revised estimates of the normalized forward and backward prediction errors, denoted respectively by $\tilde{f}_{k,h}(n)$ and $\tilde{b}_{k,h}(n)$. In the case of the nodes along the diagonal where h=K−k−1, the normalized forward prediction error $\tilde{f}_{k,h}(n)$ is not used and the related circuits could therefore be omitted.

The lattice update circuit 760 scales the normalized forward and backward prediction errors $\tilde{f}_{k-1,h}(n)$ and $\tilde{b}_{k-1,h+1}(n)$ input to the connecting node 730 by a corresponding reflection coefficient $\kappa_{k,h}$. More particularly, the forward prediction error $\tilde{f}_{k-1,h}(n)$ input to the connecting node 730 is multiplied by the reflection coefficient $\kappa_{k,h}$ and the resulting product is added to the backward prediction error $\tilde{b}_{k-1,h+1}(n)$ to generate a revised backward prediction error $b_{k,h}(n)$. Similarly, the backward prediction error $\tilde{b}_{k-1,h+1}(n)$ input to the connecting node 730 is multiplied by the conjugate of the reflection coefficient, denoted $\kappa^*_{k,h}$, and the resulting product is added to the forward prediction error $\tilde{f}_{k-1,h}(n)$ to generate a new forward prediction error $f_{k,h}(n)$. For purposes of this application, the reflection coefficient $\kappa_{k,h}$ and its conjugate $\kappa^*_{k,h}$ are considered to be the connection coefficients for the lattice predictor model. The revised forward and backward prediction errors may be expressed by:

$$f_{k,h}(n) = \tilde{f}_{k-1,h}(n) + \kappa^*_{k,h} \tilde{b}_{k-1,h+1}(n) \qquad \text{Eq. 12}$$

$$b_{k,h}(n) = \tilde{b}_{k-1,h+1}(n) + \kappa_{k,h} \tilde{f}_{k-1,h}(n) \qquad \text{Eq. 13}$$

The normalization circuit 770 multiplies the revised forward and backward prediction errors $f_{k,h}(n)$ and $b_{k,h}(n)$ by a corresponding normalization factor $\alpha_{k,h}$ to generate new normalized forward and backward prediction errors $\bar{f}_{k,h}(n)$ and $\bar{b}_{k,h}(n)$, which may be expressed as:

$$\bar{f}_{k,h}(n) = \alpha_{k,h} f_{k,h}(n) \qquad \text{Eq. 14}$$

$$\bar{b}_{k,h}(n) = \alpha_{k,h} b_{k,h}(n) \qquad \text{Eq. 15}$$

The normalization introduced into the nodes 710, 730 is used to enforce wide sense stationary. For a given node Node$_{k,h}$, where $0 \leq k \leq K-1$ and $0 \leq h \leq K-k-1$, the normalization factor $\alpha_{k,h}$ is given by:

$$\alpha_{k,h} = (\text{var}(b_{k,h}(n)))^{-\frac{1}{2}} \alpha = (E[(b_{k,h}(n) - m_{k,h})(b_{k,h}(n) - m_{k,h})^*])^{-\frac{1}{2}} \alpha \qquad \text{Eq. 16}$$

where the term var denotes variance, the term E denotes expected value, and the term $m_{k,h}$ denotes the mean of the backward prediction error $b_{k,h}(n)$ and equals zero when the input signal x(n) has zero mean. It has been previously noted that, in the case of the root nodes, the backward prediction error equals the power basis function output signal. The term $\alpha$ is the desired square root of variation and is normally static. For most applications, the desired variance may be set equal to 1 to get good performance.

The reflection coefficients $\kappa_{k,h}$ and $\kappa^*_{k,h}$ applied by the connecting nodes 730 are evaluated based on an input sequence of N samples $\{x(0), x(1), \ldots, x(N-1)\}$. The reflection coefficient $\kappa_{k,h}$ for the connecting nodes 630 where $0 \leq h \leq K-k-1$ is given by:

$$\kappa_{k,h} = \frac{2 \sum_{n=0}^{N-1} b_{k-1,h+1}(n) f^*_{k-1,h}(n)}{\sum_{n=0}^{N-1} [|f_{k-1,h}(n)|^2 + |b_{k-1,h+1}(n)|^2]} \qquad \text{Eq. 17}$$

where the superscript * denotes conjugation.

The lattice predictor model for the orthogonal basis function generator 700 described above could be used to implement a predistorter 110 as shown in FIGS. 1 and 2. In this case, the normalization factors $\alpha_{k,h}$ for each node 710, 730 and the reflection coefficients $\kappa_{k,h}$ for the connecting nodes 730 need to be evaluated. If the input signal x(n) is wide sense stationary, the reflection coefficients $\kappa_{k,h}$, $\kappa^*_{k,h}$ and normalization factors $\alpha_{k,h}$ could be evaluated based on a sequence of N consecutive input samples x(n). The predistorter 110 could then be statically configured with the computed normalization factors $\alpha_{k,h}$ and reflection coefficients $\kappa_{k,h}$. If the input signal is not wide sense stationary, the normalization factors $\alpha_{k,h}$ and reflection coefficients $\kappa_{k,h}$ may need to be reevaluated periodically. In this case, the statistics of the input signal may be monitored and the connection coefficients may be periodically updated. The statistics of the input signal may remain static for periods of time and then change. Thus, once the connection coefficients are computed, the connection coefficients may be used to predistorter the input signal until the statistics of the input signal indicate the need for new connection coefficients. As noted previously, the reflection coefficients $\kappa_{k,h}$ in lattice model of the predistorter 110 are considered to be connecting coefficients.

Because the basis function set, lattice update function, and normalization function are all linear, the predistorter 110 could equivalently be implemented by the orthogonal basis function generator 500 shown in FIG. 6. In this case, the reflection coefficients $\kappa_{k,h}$, $\kappa^*_{k,h}$ and normalization factors $\alpha_{k,h}$ computed based on the lattice predictor model of the basis function set could be used to derive the connection coefficients for the connecting nodes 530 in the network structure 500.

Figure 11:
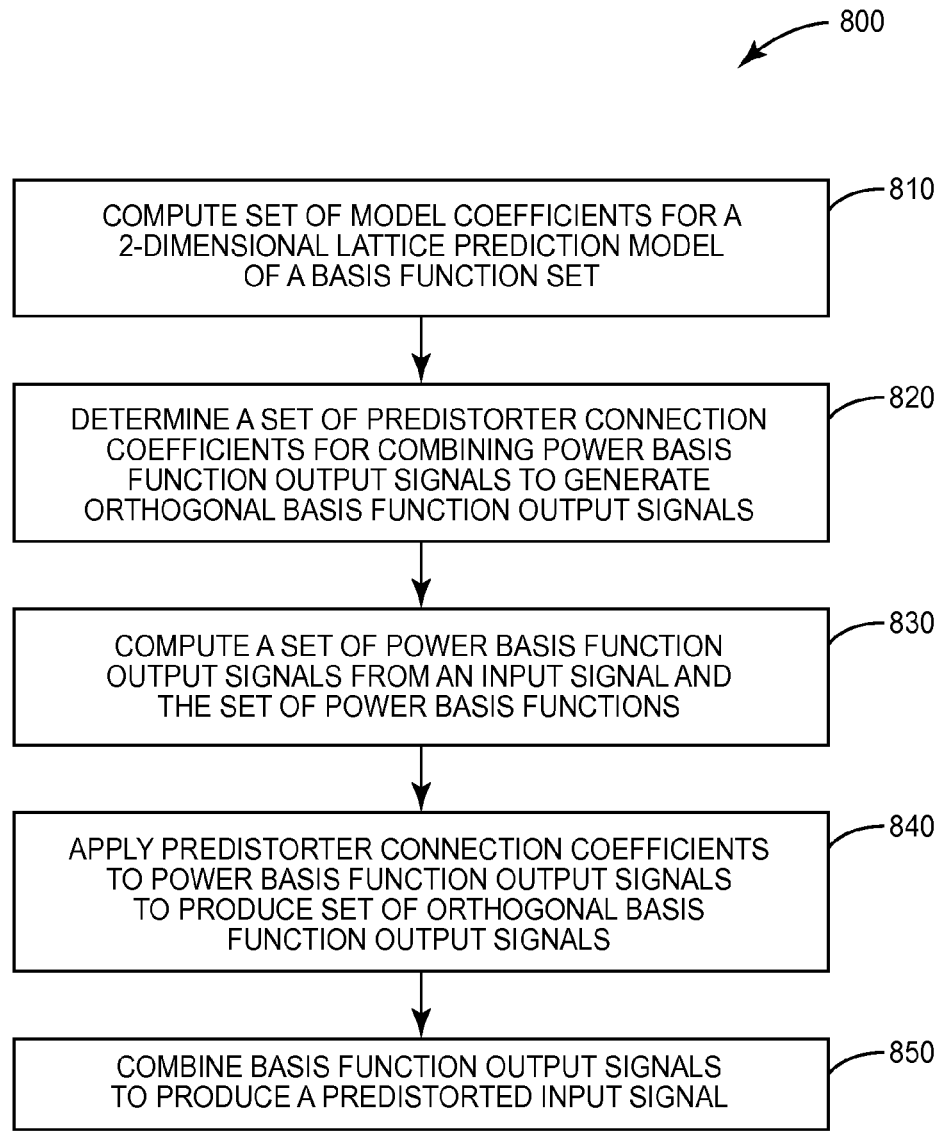
FIG. 11 illustrates an exemplary method of predistorting an input signal to a power amplifier.

FIG. 11 illustrates an exemplary method 800 of predistorting an input signal to an electronic device to compensate for distortion introduced by the electronic device. A finite sequence of input signal samples is applied to a coefficient evaluation circuit that determines the connection coefficients for an orthogonal basis function set modeled as shown in FIG. 6 or 8. The coefficient evaluation circuit computes a set of model coefficients for a two-dimensional lattice prediction model of a basis function set based on the input signal samples (block 810). The lattice prediction model represents the basis functions in the predistorter basis function set as different combinations of power basis functions as shown in FIG. 10. In one embodiment, the model coefficients comprise the reflection coefficients for the lattice predictor model of the orthogonal basis function set as shown in FIG. 10. The model coefficients may be computed according to Equation 17. The coefficient evaluation circuit then determines, from the set of model coefficients, a corresponding set of predistorter connection coefficients for combining power basis function output signals from the power basis functions to generate orthogonal basis function output signals (block 820). In one exemplary embodiment, the predistorter 110 is based on the same lattice prediction model for the basis function set as the coefficient evaluation circuit. In this case, the model coefficients (e.g., reflection coefficients) can be used as predistorter connection coefficients because the two models are the same. In this case, it would also be necessary to periodically evaluate the normalization factor for each connecting node 530. In other embodiments of the invention, the predistorter 110 may implement an equivalent model for the basis function set as shown in FIG. 6 where the orthogonal basis functions are modeled as sums of power basis function output signals weighted by respective connection coefficients. In this case, the predistorter connection coefficients may be computed from the model coefficients and the corresponding normalization factors derived for the lattice prediction model. The predistorter 110 is then configured with the connection coefficients computed at 820.

As previously noted, the predistorter 110 is used to predistort an input signal sample to compensate for the distortion introduced by a power amplifier or other non-linear device. An input signal is applied to the pre-configured predistorter 110. The predistorter 110 computes a set of power basis function output signals by applying a set of power basis functions to the input signal sample, (block 830). The set of predistorter connection coefficients computed in block 820 are then applied to the power basis function output signals to produce a set of orthogonal basis function output signals (block 840). The basis function output signals, in turn, are weighted by respective weighting coefficients and combined to generate a predistorted input signal for input to a power amplifier (block 850). It should be noted that the input signal sample being predistorted in blocks 830 through 850 need not be the same as the one used to derive the connection coefficients in blocks 810 and 820. In practice, the statistics of the input signal may be monitored and the connection coefficients may be periodically updated. The statistics of the input signal may remain static for periods of time and then change. Thus, once the connection coefficients are computed, the connection coefficients may be used to predistort the input signal until the statistics of the input signal indicate the need for new connection coefficients.

Figure 12:
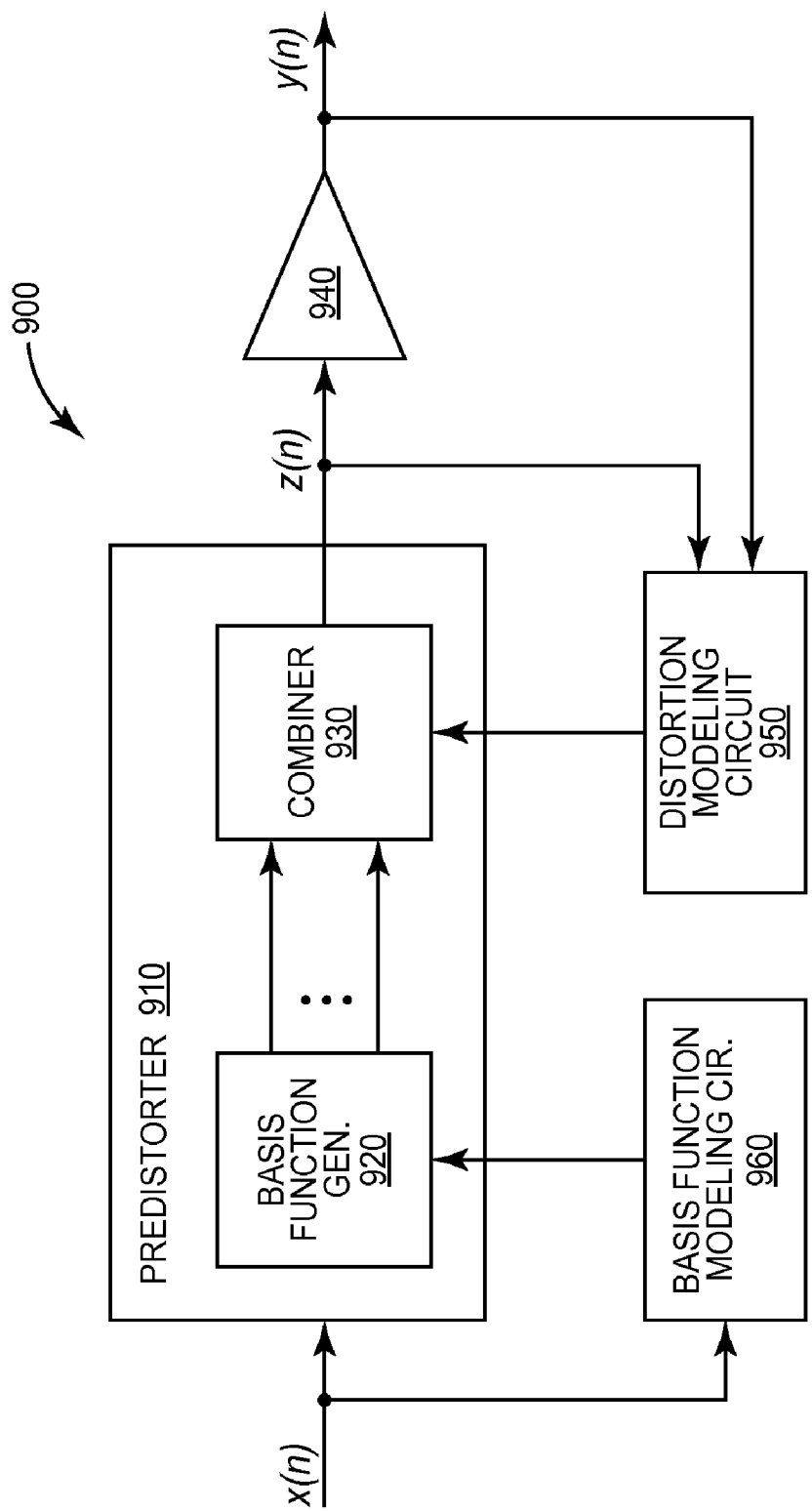
FIG. 12 illustrates an exemplary predistortion circuit for predistorting an input signal to a power amplifier.

FIG. 12 illustrates an exemplary predistortion circuit 900 according to one exemplary embodiment. The predistortion circuit 900 comprises a predistorter 910 implementing a basis function structure as shown in FIG. 4 or 8, a power amplifier 940, distortion modeling circuit 950, and basis function modeling circuit 960. An input signal x(n) is applied to a predistorter 910. The predistorter 910 comprises a basis function generator 920 and a combiner 930. The basis function generator produces a set of orthogonal basis function output signals from the input signal sample using one of the models shown in FIGS. 4 and 8. The combiner 930 sums the basis function output signals weighted by respective weighting coefficients to produce the predistorted input signal z(n) The power amplifier 940 amplifies the predistorted input signal z(n) to produce an output signal y(n). The power amplifier may be operated in a non-linear mode to efficiently amplify the predistorted input signal. The predistortion applied by the predistorter compensates for the distortion introduced by the power amplifier so that the cascade of the predistorter and power amplifier is nearly linear.

The distortion modeling circuit 950 determines the weighting coefficients applied by the combiner 930 to the basis function output signals to produce the predistorted signal z(n). The distortion modeling circuit 950 may use well-known techniques described above to compute the weighting coefficients by modeling the distortion of the power amplifier or predistorter. Generally, the distortion modeling circuit computes a set of weighting coefficients using a distortion model for the power amplifier (direct approach) or predistorter (indirect approach) that best fits the predistorted signal z(n) to the output signal y(n). Co-pending applications filed concurrently with this application entitled Joint Process Estimator with Variable Tap Delay Line for use in Power Amplifier Digital Predistortion, Configurable Basis-Function Generation for Nonlinear Modeling, and Non-Linear Model with Tap Output Normalization, describe additional techniques for computing weighting coefficients. These co-pending applications are incorporated herein in their entirety by reference.

As noted above, the predistorter 910 uses one of the models shown in FIGS. 4 and 8 to produce the orthogonal basis function output signals. In either case, the basis function modeling circuit 960 computes the connection coefficients to be applied by the basis function model from a sample sequence of the input signal x(n). Thus, the basis function set applied to the input signal by the predistorter 910 is dependent on the distribution of the input signal. By matching the orthogonal basis function set to the distribution of the input signal, the condition number of the matrix $U^H U$ produced from the orthogonal basis function set is significantly lowered. The orthogonal basis function set can be implemented using the structure shown in either FIG. 8 or FIG. 8. The structure shown in FIG. 6 is backward compatible with the power basis function set.

The basis function modeling circuit evaluates an orthogonal basis function set based on the actual input signal. Therefore, the orthogonal basis function set it derives is customized to the distribution of the input signal. With the proposed orthogonal basis function set, the condition number of the data matrix is significantly lowered. For example, simulation has shown a reduction of the condition number from about $10^8$ to about 1.0018. The basis function modeling circuit can be implemented using the orthogonal basis function model shown in FIG. 6, which is a general structure and backward compatible with the power basis function sets.

The present invention may, of course, be carried out in other specific ways than those herein set forth without departing from the scope and essential characteristics of the invention. The present embodiments are, therefore, to be considered in all respects as illustrative and not restrictive, and all changes coming within the meaning and equivalency range of the appended claims are intended to be embraced therein.

What is claimed is:

1. A method of compensating for distortion of an input signal by an electronic device that operates on the input signal to produce an output signal, said method comprising:
   computing a set of model coefficients for a two-dimensional lattice prediction model of a basis function set from a set of input signal samples over a predetermined sampling interval, wherein the lattice prediction model represents basis functions in a predistorter basis function set as different combinations of power basis functions;
   determining, from said set of model coefficients, a corresponding set of predistorter connection coefficients for combining power basis function output signals from the power basis functions to generate basis function output signals;
   computing a set of power basis function output signals from an input signal and the set of power basis functions;
   applying the set of predistorter connection coefficients to the power basis function output signals to produce a set of basis function output signals; and
   combining the basis function output signals to produce a predistorted input signal from the input signal.

2. The method of claim 1 wherein computing a set of model coefficients from a set of input signal samples comprises:
   computing, for each input signal sample, a model set of power basis function output signals;
   normalizing the model set of power basis function output signals by multiplying said power basis function output signals by corresponding normalization factors; and
   computing the set of model coefficients from the normalized model set of power basis function output signals.

3. The method of claim 2 wherein computing the set of model coefficients from the normalized model set of power basis function output signals comprises:
   computing forward and backward prediction errors for model connecting nodes in said lattice prediction model from the normalized model set of power basis function output signals; and
   normalizing the forward and backward prediction errors so that the forward and backward prediction errors have a predetermined variance; and
   computing the model coefficients for the model connecting nodes from the normalized forward and backward prediction errors.

4. The method of claim 1 wherein the predistorter applies the lattice prediction model to produce the basis function output signals and wherein the predistorter connection coefficients comprise the model coefficients for the lattice prediction model.

5. The method of claim 1 wherein the predistorter applies a linear model to produce the basis function output signals from the predistorter input signal and wherein the predistorter connection coefficients are computed from the model coefficients.

6. The method of claim 5 wherein the predistorter connection coefficients are computed as products of the models coefficients multiplied by corresponding normalization factors for the predistorter connecting nodes.

7. The method of claim 1 wherein computing a set of power basis function output signals comprises computing, for each of a plurality of sampling time instances, a set of basis function output signals from a single input signal sample and the set of power basis functions.

8. A circuit for compensating an input signal for distortion introduced by an electronic device operating on an input signal to produce an output signal, said circuit comprising:
- a basis function modeling circuit configured to:
  - compute a set of model coefficients for a two-dimensional lattice prediction model of a basis function set from a set of input signal samples over a predetermined sampling interval, wherein the lattice prediction model represents basis functions in a predistorter basis function set as different combinations of power basis functions in a set of power basis functions;
  - determine, from said set of model coefficients, a corresponding set of predistorter connection coefficients for combining power basis function output signals from the power basis functions to generate basis function output signals;
- a predistorter configured to:
  - compute a set of power basis function output signals from an input signal and the set of power basis functions;
  - apply the set of predistorter connection coefficients to the power basis function output signals to produce a set of basis function output signals; and
  - combine the basis function output signals to produce a predistorted input signal from the input signal.

9. The circuit of claim 8 wherein the basis function modeling circuit is configured to compute a set of model coefficients by:
- computing, for each input signal sample, a model set of power basis function output signals;
- normalizing the model set power basis function output signals by multiplying said power basis function output signals by corresponding normalization factors;
- computing the set of model coefficients from the normalized model set of power basis function output signals.

10. The circuit of claim 9 wherein the basis function modeling circuit is configured to compute the set of model coefficients from the normalized model set of power basis function output signals by:
- computing forward and backward prediction errors for model connecting nodes in said lattice prediction model from the normalized model set of power basis function output signals; and
- normalizing the forward and backward prediction errors so that the forward and backward prediction errors have a predetermined variance; and
- computing the model coefficients for the model connecting nodes from the normalized forward and backward prediction errors.

11. The circuit of claim 8 wherein the predistorter is configured to apply the lattice prediction model to produce the basis function output signals and wherein the predistorter connection coefficients comprise the model coefficients for the lattice prediction model.

12. The circuit of claim 8 wherein the predistorter is configured to apply a linear model to produce the basis function output signals from the predistorter input signal and wherein the predistorter connection coefficients are computed from the model coefficients.

13. The circuit of claim 12 wherein the predistorter is configured to compute the predistorter connection coefficients are computed as a product of the model coefficients by respective normalization factors for the predistorter connecting nodes.

14. The circuit of claim 8 wherein the predistorter is configured to compute, for each of a plurality of sampling time instances, a set of basis function output signals from a single input signal sample and the set of power basis functions.

* * * * *

UNITED STATES PATENT AND TRADEMARK OFFICE
CERTIFICATE OF CORRECTION

PATENT NO.         : 8,368,466 B2
APPLICATION NO.    : 13/119157
DATED              : February 5, 2013
INVENTOR(S)        : Bai It is certified that error appears in the above-identified patent and that said Letters Patent is hereby corrected as shown below:

On the Title Page, in Item (56), under "OTHER PUBLICATIONS", in Column 2, Line 4, delete "et la." and insert -- et al. --, therefor.

In the Specification

In Column 2, Line 39, delete "a indirect" and insert -- an indirect --, therefor.

In Column 2, Line 56, delete "generator" and insert -- generator. --, therefor.

In Column 4, Line 28, delete "$\{u_0(n), (n),$" and insert -- $\{u_0(n),$ --, therefor.

In Column 4, Lines 30-31, delete "$\{u_0(n), (n),$" and insert -- $\{u_0(n),$ --, therefor.

In Column 4, Line 32, delete "$\{u_0(n), (n),$" and insert -- $\{u_0(n),$ --, therefor.

In Column 4, Line 34, delete "$\{w_0(n), (n),$" and insert -- $\{w_0(n),$ --, therefor.

In Column 5, Line 25, delete "$\{u_0(n), (n),$" and insert -- $\{u_0(n),$ --, therefor.

In Column 5, Line 27, delete "$\{w_0(n), (n),$" and insert -- $\{w_0(n),$ --, therefor.

In Column 5, Line 34, delete "$\{u_0(n), (n),$" and insert -- $\{u_0(n),$ --, therefor.

In Column 5, Line 36, delete "$\{u_0(n), (n),$" and insert -- $\{u_0(n),$ --, therefor.

In Column 5, Line 47, delete "d(n)." and insert -- d. --, therefor.

In Column 6, Line 30, delete "$f_{ORTHO,k}(n))$." and insert -- $f_{ORTHO,k}(x(n))$. --, therefor.

Signed and Sealed this
Eleventh Day of June, 2013

Teresa Stanek Rea
*Acting Director of the United States Patent and Trademark Office*

CERTIFICATE OF CORRECTION (continued)
U.S. Pat. No. 8,368,466 B2

In Column 6, Line 52, delete "form" and insert -- from --, therefor.

In Column 9, Line 53, delete " $\overline{b}_h(n).$ " and insert -- $\overline{b}_{k,h}(n).$ --, therefor.

In Column 9, Line 67, in Equation (9), delete " $f_{\text{orth},k-1}(x(n)) = \overline{b}_{k-1,0}(n)$ " and insert -- $f_{ORTHO,k-1}(x(n)) = \overline{b}_{k-1,0}(n)$ --, therefor.

In Column 10, Line 58, delete " $X_{k,h}$ " and insert -- $K_{k,h}$ --, therefor.

In the Claims

In Column 14, Line 42, in Claim 3, delete "signals; and" and insert -- signals; --, therefor.

In Column 16, Line 8, in Claim 10, delete "signals; and" and insert -- signals; --, therefor.